United States Patent [19]
Preslar

[11] Patent Number: 5,920,224
[45] Date of Patent: Jul. 6, 1999

[54] NETWORK FOR IMPROVING ELECTRO-MAGNETIC INTERFERENCE RESPONSE

[75] Inventor: Donald Ray Preslar, Somerville, N.J.

[73] Assignee: Harris Corporation, Melbourne, Fla.

[21] Appl. No.: 09/024,203

[22] Filed: Feb. 17, 1998

[51] Int. Cl.⁶ ................................................. H03K 5/08
[52] U.S. Cl. .......................... 327/326; 327/110; 327/309
[58] Field of Search ..................... 327/108, 109, 327/110, 111, 112, 309, 310, 312, 313, 314, 318, 319, 320, 325, 326, 327, 328, 374, 376, 377, 379, 380, 381, 384, 389, 419, 427, 478, 482

[56] References Cited

U.S. PATENT DOCUMENTS

| | | | |
|---|---|---|---|
| 5,001,373 | 3/1991 | Bator et al. | 307/542 |
| 5,764,088 | 6/1998 | Lavieville et al. | 327/110 |

*Primary Examiner*—Timothy P. Callahan
*Assistant Examiner*—Jeffrey Zweizig
*Attorney, Agent, or Firm*—Henry I. Schanzer

[57] ABSTRACT

A network is connected between the drain and gate of a transistor for limiting the overshoot and controlling the waveshape of the signal produced at the drain of the transistor, when the transistor is being turned-off. The network includes a series string of zener diodes with one or more by-pass capacitors connected across one or more zener diodes for shaping the output signal produced at the drain of the transistor and for reducing electromagnetic radiation. The network also includes unidirectional conducting elements for discharging each bypass capacitor each time the transistor is turned-on. The zener diodes and the "discharging" unidirectional conducting elements of the network may be formed as integral parts of the same integrated circuit (IC). For best results, the bypass capacitors are connected across the zener diodes closest to the gate of the transistor.

26 Claims, 13 Drawing Sheets

NETWORK FOR IMPROVING ELECTROMAGNETIC INTERFERENCE RESPONSE

BACKGROUND OF THE INVENTION

This invention relates to wave-shaping circuitry for controlling the electro-magnetic-interference (EMI) generated by an inductive load when the circuit driving the inductive load is being turned-off.

A problem which exists in the art, and which is resolved by the present invention, may be best explained by reference to the circuit of FIG. 1 which illustrates a prior art scheme for controlling the EMI generated by an inductive load. A double diffused metal-oxide-semiconductor (DMOS) field effect power transistor, T1, is used to apply power to a solenoid, S1; (i.e., T1 is a solenoid driver). The source-to-drain (i.e., conduction) path of T1 is shown connected between an output terminal 10 and a ground terminal 12. The solenoid (S1) includes inductance, represented by an inductor L1, and resistance represented by a resistor R1. The solenoid is connected between the output terminal 10 and the positive terminal 14 of a battery 16 whose negative terminal is returned to ground.

The turn-on and turn-off of T1 is controlled by a control circuit 18 having an input signal Ein. When Ein is low, transistor P3 is turned on and transistor N3 is turned off. When P3 is turned on, a turn-on current source I1 is mirrored via transistor P1 and P2 such that a current proportional to I1 flows into the gate electrode 11 of T1, turning it on. As is well known in the art, when T1 is turned on current flows from the power source 16 through the solenoid and the conduction path of T1 to ground.

The turn-off of T1 occurs when Ein goes high. Ein high, causes P3 to turn off and N3 to turn-on. When N3 is turned on, an off-current source I2 is mirrored via transistors N2 and N1. A current proportional to I2 then flows through the conduction paths of N3 and N1 discharging the gate 11 of T1 to ground. The current sources I1 and I2 control the charging and discharging rates of the gate-to-drain capacitance of T1 and hence the corresponding turn-on and turn-off slew rates at output terminal 10.

As is known in the art, when T1 is turned off and the current through the solenoid is interrupted, there is an inductive kick at output terminal 10. The inductive kick may produce a high positive going voltage at terminal 10 which is many times the amplitude (e.g., 200–1000 volts) of the battery voltage (e.g., 12 volts).

Transistor T1 is thus subjected to a very high voltage at its drain, 10, while its gate, 11, is being driven to zero volts (i.e., a cut-off condition). The breakdown voltage (BV) of T1 may be exceeded resulting in catastrophic failure. To protect T1, a zener protection network, such as network 17 shown in FIG. 1, may be connected between its gate and drain. In its simplest form, the protection network 17 would take the form of zener network 17b shown in FIG. 2 including a zener diode Za, a diode D1 and a current limiting resistor R2 connected between the drain and gate of T1. Note that diode D1 is a "normal" blocking diode, not a zener, with its anode connected to the zener and its cathode coupled to the gate of T1. Diode D1 is necessary to prevent the "ON" gate drive current from being conducted into the drain of T1 through the forward biased zener, Za. Thus, D1 is poled to block conventional current flow from the gate into the drain of T1, while enabling conventional current flow from the drain into the gate of T1.

When the drain of T1 is driven to a high voltage which exceeds the zener voltage (Vz) of Za (e.g., 80 volts), Za conducts and raises the gate voltage of T1 tending to turn T1 back on and thereby limiting the drain voltage. The voltage fed back to the gate of T1 is then discharged to ground via the series connected conduction paths of N3 and N1 of network 18 (See FIG. 1) which mirror the current I2 through N2.

In addition to protecting T1, the zener, Za, provides a stable, accurate clamping voltage. In DMOS solenoid driver applications which use the DMOS voltage clamping region for solenoid turn-off, the zener yields a predictable turn-off voltage and turn-off time. That is, with a simple inductive load (neglecting the resistance R1) and a constant clamping voltage ($V_{CL}$) the turn-off time ($t_{off}$) of the inductor L1 may be expressed as:

$$t_{off} = (L1)(I1)/V_L \qquad \text{eq. 1}$$

where:
1. The voltage $V_L$ across the inductive load=$V_{10}-V_{DD}$;
2. $V_{10}=V_{CL}=V_Z+V_D+V_T$; and
   $V_D$ is the forward voltage drop of diode D1;
   $V_T$ is the threshold voltage of transistor T1;
   $V_{10}$ is the voltage at the drain of T1;
   $V_z$ is the zener voltage of Za;
   L1 is the inductance of the solenoid; and
   I1 is the current through the inductor L1.

The zener diode Za is most often constructed from several zener diodes connected in series (as shown in FIG. 1) in order to achieve a higher clamping voltage (Vz) and, hence, faster turn-off times (see eq. 1).

Referring back to FIG. 1, eight zener diodes Z1 through Z8 are shown connected in series. Each zener could, for example, have a zener breakdown voltage (Vz) of 10 volts, whereby the total breakdown of the eight zeners would be 80 volts. In addition, where the zener voltage is not exactly the voltage required and the gate "turn-off" drive is a current source, a resistor R2 is connected in series with the zeners in the feedback (zener) path to create an additional voltage drop equal to the amplitude of the current therethrough times the value of R2. This additional voltage drop adds to the voltage provided by the zeners.

However, when a high inductive kick is produced and clamping is introduced, a significant amount of electro-magnetic radiation is produced primarily due to the sharp corner in the waveform when clamping occurs. A technique has been developed to reduce the electro-magnetic-interference (EMI) generated by the fast high voltage waveforms produced at the drain of T1. This technique includes the addition of capacitors (e.g., See C1, C5 in FIG. 1) across one or more of the zeners. It may also include the addition of a resistor such as R2, if not already present. The capacitors C1, C5 in FIG. 1 tend to short out the zeners (Z1, Z5) across which they are connected when zener breakdown first occurs. Thus, by way of example, the initial breakdown for the eight zeners diodes shown in FIG. 1 would be 60 volts, rather than 80 volts. This is so, since two zeners (Z1, Z5) are bypassed by capacitors (C1, C5) which initially function to shunt the zeners. Then, as current continues to flow, the by-pass capacitors (C1, C5) charge up and when the voltage across these capacitors exceeds the zener voltages of their corresponding zeners (Z1, Z5), the zeners clamp (or limit) the voltage to a total zener breakdown voltage of 80 volts. Thus, a gently rounded waveform is produced at the drain of T1 as its voltage approaches the maximum clamp voltage (e.g., 80 v), as shown in FIG. 3. The shape of the output signal ($V_{10}$ in FIG. 3) may be referred to as a squared cosine waveshape. This waveshaping technique results in the production of an output having a gently rounded shape at the beginning of the turn-off waveform due to the natural slow turn-off characteristics of T1 and also a gently rounded shape at the top of the waveform as it approaches the clamp level due to the combination of the time constant for the resistor/capacitor network, the constant turn-off current, and the connection of one, or more, capacitors across one or more of the zeners.

A problem with the circuit of FIG. 1 is that the by-pass capacitor(s), once charged, will remain charged. That is, whenever T1 is turned-off, the by-pass capacitors (e.g., C1, C5) are charged up. Then, if T1 is subsequently turned-on and then turned-off, no benefit is derived from the by-pass capacitor(s), if the charge on the by-pass capacitors (C1, C5) has not leaked off or been discharged.

An object of this invention is to resolve this problem and to provide an efficient constantly reusable clamp circuit which includes means for reducing electromagnetic interference.

SUMMARY OF THE INVENTION

Applicant's invention resides, in part, in the recognition of the problem present in the prior art due to the non-discharging of the by-pass capacitors connected across zener diodes. Applicant's invention also resides in circuitry for ensuring that, where zener diodes are connected between the output and control electrodes (i.e., a feedback path) of a transistor, T1, any by-pass capacitor, connected across any zener diode in the feedback path, which gets charged-up when T1 is being turned-off, is discharged each time T1 is turned-on. Therefore, the by-pass capacitors are in a discharged condition whenever T1 is subsequently being driven to a turned-off condition, and each by-pass capacitor is capable of performing its designed by-pass function whenever T1 is being turned-off, after being turned-on.

Applicant's invention also resides in highly efficient protective ("zener") networks containing by-pass capacitors where the networks include "discharge" diodes formed as an integral part of the zener networks for providing discharge paths for the by-pass capacitors.

Applicant's invention also resides in optimizing the location of bypass capacitors along a zener network located between the output and control electrode of a transistor, to obtain better results for wave shaping and EMI control.

BRIEF DESCRIPTION OF THE DRAWINGS

In the accompanying figures like reference characters denote like components.

DETAILED DESCRIPTION OF THE INVENTION

Figure 4:
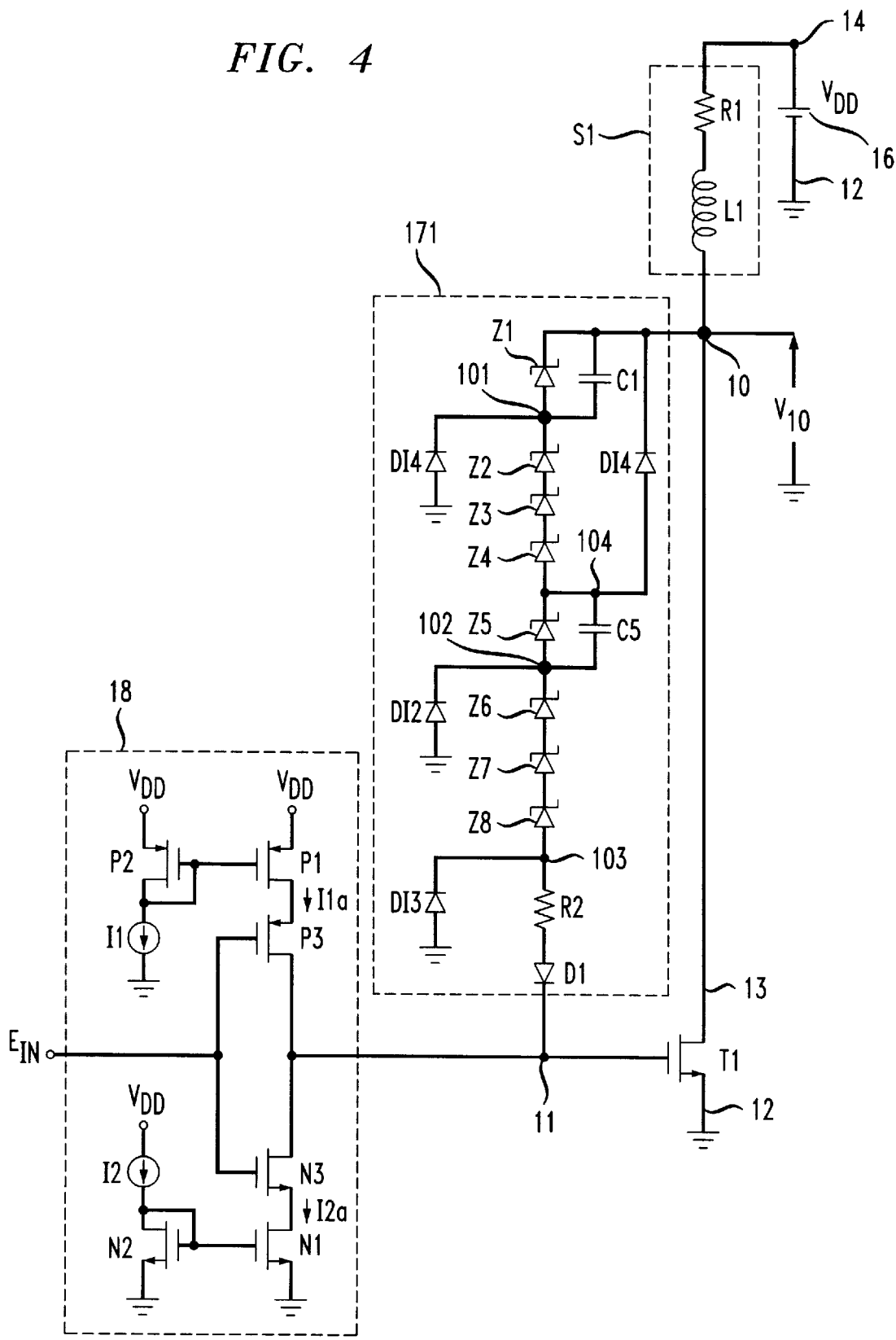
FIG. 4 is a schematic diagram of a circuit with a zener network embodying the invention.

The circuit shown in FIG. 4 is designed to control the EMI generated by a solenoid S1 when the current flowing through the solenoid is interrupted. The solenoid S1 has an inductance L1, and a resistance R1 which are shown to be connected in series between a first power terminal 14 and output terminal 10. A power transistor T1 is used to control the application of power to the solenoid S1. T1 may be anyone of a number of devices such as a metal oxide semiconductor (MOS), a metal-oxide-semiconductor field effect transistor (MOSFET), a DMOS, a bipolar transistor or an insulated-gate bipolar transistor (IGBT). For purpose of illustration, T1 is assumed to be a DMOS having a source electrode 12, a drain (output) electrode 13 and a gate (control) electrode 11. The source (12) and drain (13) electrodes of T1 define the ends of a conduction channel whose conductivity is controlled by the potential applied to its gate electrode 11. The source-drain (i.e., conduction) path of T1 is connected between output terminal 10 and ground terminal 12. The drain of T1 is connected to terminal 10, its gate is connected to (and defines) terminal 11 and its source is connected to terminal 12. A source of potential, 16, a battery, 16, providing $+V_{DD}$ volts, is connected at its positive terminal to terminal 14 and at its negative terminal to ground terminal 12, as in FIG. 1.

A feedback network 171 is connected between the drain (terminal 10) and the gate (terminal 11) of T1, as in FIG. 4. However, in the circuit of FIG. 4, unlike the one shown in FIG. 1, as discussed below, the by-pass capacitors are discharged each time T1 is turned-on and therefore, they are placed in a discharged condition before T1 is being turned off. The turn-on and turn-off of T1 is controlled by a control circuit 18 having an input signal Ein, as in FIG. 1. When Ein is low, transistor P3 is turned on and transistor N3 is turned off. When P3 is turned on, a turn-on current is supplied to the gate of transistor T1 turning it on. When T1 is turned-on, current flows from $V_{DD}$ through R1 and L1 and the conduction path of T1 to ground. When T1 is operating as a turned-on switch, the voltage at output terminal 10 is close to ground potential. Hence, with diode D1 connected to block the flow of current from node 11 into node 10, no current flows through the feedback network 171 connected between output terminal 10 and the gate 11 of T1.

The turn-off of the T1 switch occurs when Ein goes high. Ein high, causes P3 to turn off and N3 to turn-on. When N3 is turned on, a current I2a, which is proportional to current I2, can flow from the gate of T1, via the conduction paths of N3 and N1, discharging the gate of T1 towards ground potential.

As noted above, when T1 is being turned off and the current through the solenoid is interrupted, there is an inductive kick at output terminal 10. The inductive kick may cause a voltage (e.g., 200–1000 volts) to be produced at terminal 10, which is many times the amplitude of the battery voltage (e.g., 12 volts).

T1 is thus subjected to a very high voltage at its drain while its gate is being driven to zero volts (i.e., a cut-off condition). To protect T1, a zener protection network 171 is connected between the gate 11 and drain 10 of T1. For ease of explanation, the zener network shown in FIG. 4 includes eight (8) zeners (Z1–Z8) connected in series (so that their zener voltages add) between output terminal 10 and an intermediate node 103. A forward biased diode D1 and a resistor R2 are connected between node 103 and gate terminal 11. Diode D1 is a "normal" blocking diode, not a zener. That is, diode D1 is connected to prevent the "turn-on" gate drive current from being conducted into the drain of T1 through the forward biased zener diodes. Resistor R2 is connected in series with the zeners in the feedback path to create an additional voltage drop equal to the amplitude of the current source (e.g., I2a) times the value of R2.

The zener network 171 of FIG. 4 includes by-pass capacitors (C1, C5) to reduce the electro-magnetic-interference (EMI) generated by the fast high voltage waveforms produced at the drain of T1. A "by-pass" capacitor C1 is shown connected across zener diode Z1 and a "by-pass" capacitor C5 is shown connected across zener diode Z5. The "by-pass" capacitors C1 and C5 are intended to initially short out the zeners (Z1, Z5) across which they are connected, as discussed above. Thus, by way of example, in response to a high amplitude inductive kick (e.g. of more than 80 volts), the breakdown voltage for the eight zeners diodes shown in FIG. 4 would be such that the two zeners (Z1, Z5) across which "by-pass" capacitors (C1, C5) are connected, would be shunted while the remaining 6 zeners (Z2–Z4 and Z6–Z8) would breakdown. Assuming for the purpose of illustration that each one of the zeners has a breakdown voltage of 10 volts, the voltage at output terminal 10 would be limited initially to be approximately 60 volts above the gate voltage of T1. Then, as current continues to flow, the "by-pass" capacitors (C1, C5) charge up and if, and when, the voltage across these capacitors reaches the zener voltages of their corresponding zeners, the zeners (Z1, Z5) clamp (or limit) the voltage across their respective capacitors to their zener voltage. Thus, a gently rounded waveform is produced at output terminal 10 as the voltage at the drain of T1 approaches the maximum clamp voltage of 80 volts.

Figure 1:
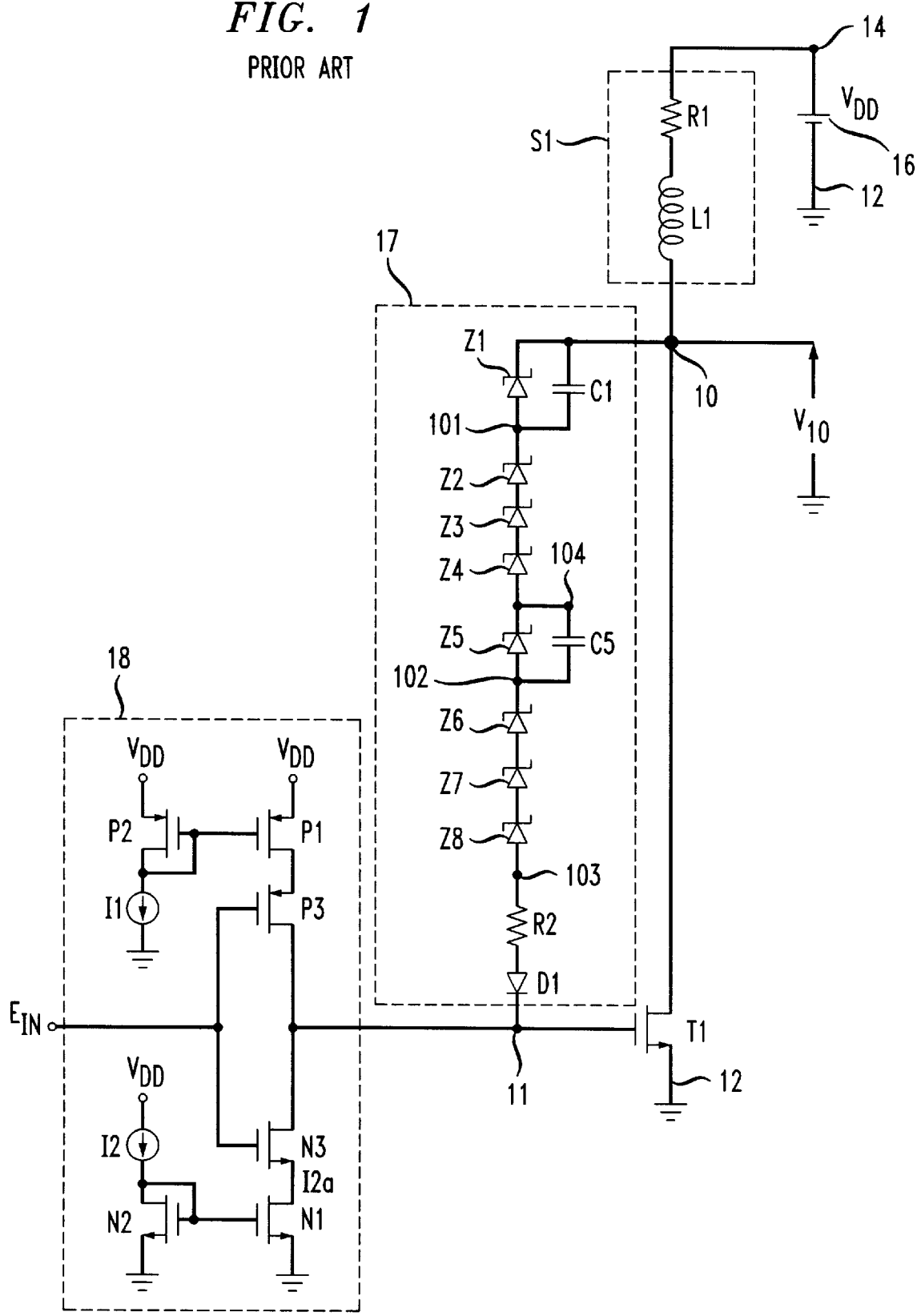
FIG. 1 is a schematic diagram of a circuit with a compound zener protection network in accordance with the prior art.
Figure 2:
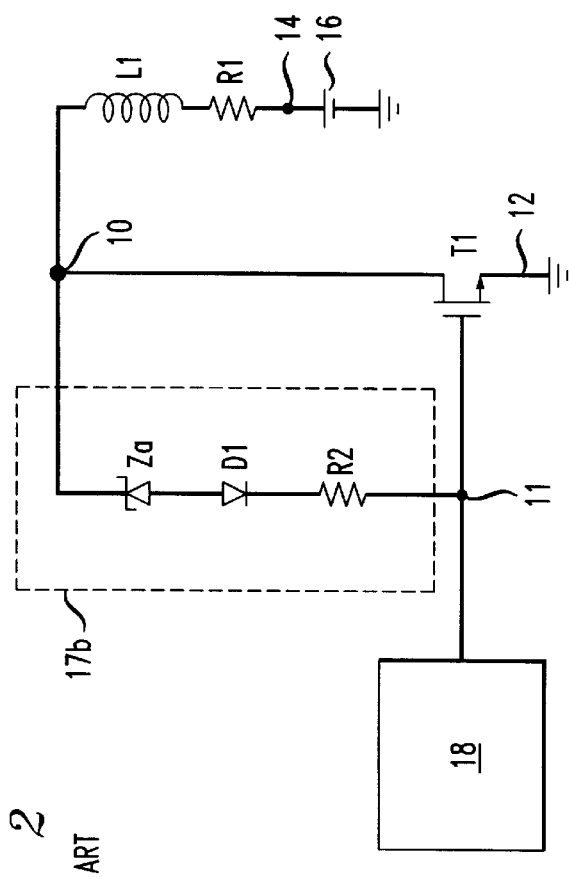
FIG. 2 is a simplified schematic diagram of the prior art circuit of FIG. 1.
Figure 3:
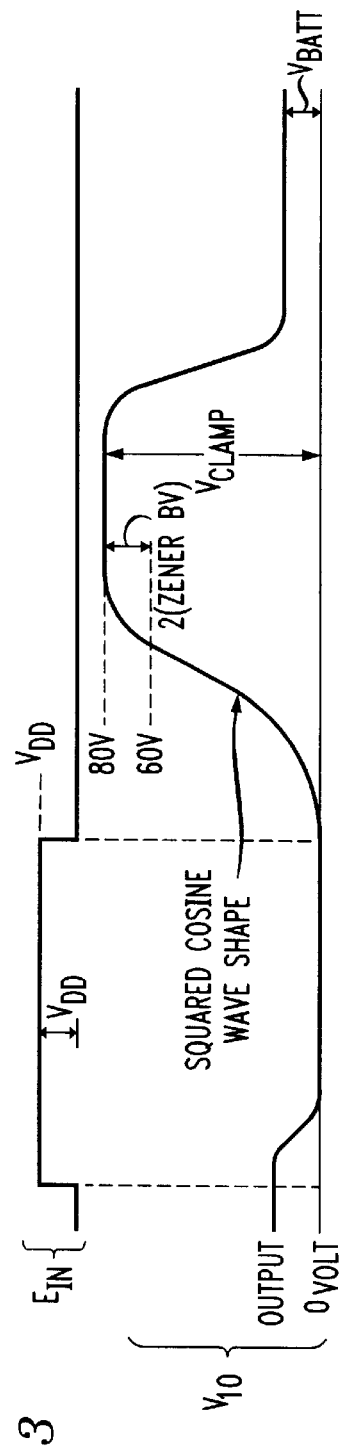
FIG. 3 is a waveform diagram of a desired response at the output of the circuit.

When zener breakdown occurs, T1 is held on in the conducting state in order to slowly discharge the energy stored in the solenoid. However, at the end of the turn-off cycle, each one of capacitors C1 and C5 is (and remains) charged at 10 volts, for the numbers and values assumed above. If, as in the prior art, once they are charged, C1 and C5 remain charged, then when T1 is subsequently turned-on and then subsequently turned-off, the by-pass shunting effect of C1 and C5 is not present. In the inventive circuit of FIG. 4, the problem with the prior art circuit of FIG. 1 is resolved by the addition of isolation ("discharge") diodes DI1 and DI2 to provide discharge paths for bypass capacitors C1, C5 whenever T1 is turned-on.

Diode DI1 is shown connected with its anode connected to ground and its cathode connected to an internal node 101. In a like manner, diode DI2 is shown connected with it anode at ground and its cathode connected to an internal node 102. Diodes DI1 and DI2 are designed to function as blocking diodes (not zeners); each one of diodes DI1 and DI2 is selected or designed to have a reverse breakdown voltage in excess of the sum of the zener voltages (e.g. 80 volts) in the zener network 171 and to have a normal forward voltage drop ($V_F$ or $V_D$); which may be assumed to be 0.8 volts, although it can be higher or lower depending on the level of "forward" current through the diode.

The function of diodes DI1 and DI2 is best explained as follows. When T1 is turned-on, DI1 provides a conduction path for C1 so that C1 can discharge via the forward path of DI1 and the conduction path (drain-source) path of T1 to ground. Likewise, when T1 is turned-on, DI2 provides a conduction path for C5 so that C5 can discharge via the forward path of DI2 and the forward paths of Z4, Z3, Z2 and Z1 and the conduction path (drain-source) of T1 to ground.

Thus, as soon as (and whenever) T1 is turned-on, capacitors C1 and C5 get discharged and are readied to subsequently function as by-pass or shunting capacitors. When T1 is subsequently turned-off and an inductive kick of more than 80 volts is produced at output terminal 10, capacitors C1 and C5 initially shunt the zener diodes (Z1, Z5) across which they are connected limiting the initial value of the clamping voltage to a first value of approximately 60 volts, where each zener has an assumed breakdown voltage of 10 volts. Then, as capacitors C1 and C5 charge up, the clamping voltage rises to a second value of approximately 80 volts. Capacitors C1 and C5 will get charged-up and store the charge corresponding to the zener voltage. The critical point is that they will remain charged-up when T1 is turned off and they will tend to retain the charge. However, in the circuit of FIG. 4, capacitors C1 and C5 will get discharged when T1 is subsequently turned-on, whereby they will always be "readied" to function as by-pass capacitors when T1 is later turned-off.

FIG. 4 shows the addition of a ("discharge") diode DI4, between internal node 104 and output terminal 10. Diode DI4 functions to provide a lower impedance discharge path for capacitor C5. This diode (DI4) may not be needed, if the speed of discharge of C5 via the zeners (Z1–Z4) is sufficiently fast. Also, as discussed below, the function provided by DI4 may be provided by one or more diodes formed as part of the zener diode network(s).

FIG. 4 also shows the addition of a ("discharge") diode DI3 connected between an internal node 103 and ground. DI3 is an optional diode to enable the discharge of any parasitic capacitance along the zener string whenever T1 is turned on. Thus, DI3 functions to discharge any parasitic capacitance which might be charged, particularly any parasitic capacitance near the end portion of the zener network close to the gate of T1.

One aspect of Applicant's invention is the construction of diodes DI1, DI2 and DI3 as an integral part of the protective diode network 171. When so formed, the discharge diodes need not be specially built to provide a discharge path for the by-pass capacitors. Applicants' invention also resides, in part, in the recognition that these diodes (DI1, DI2, DI3, DI4) may be formed as part of the zener diode network 171, and may also be designed to provide better control of the shape of the output waveform.

Note that "discharge" diodes (e.g., diodes DI1, DI2, DI3, DI4) are designed to have sufficiently high reverse breakdown voltages ($V_R$) such that they do not conduct when an inductive kick is produced at output terminal 10. They are designed to have little, if any, effect on controlling the amplitude of the inductive kick and its limiting or clamping, when T1 is first turned-off.

Figure 5:
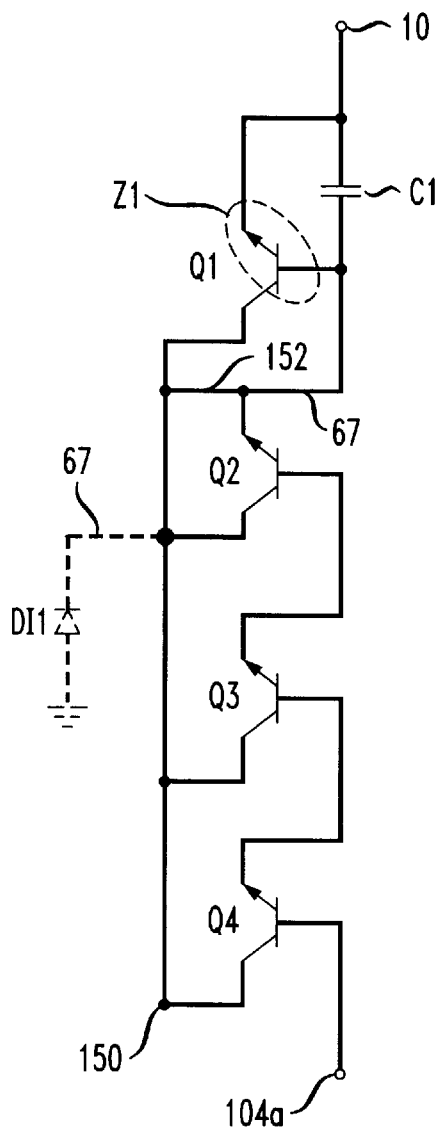
FIG. 5 is a schematic diagram of a portion of a zener network suitable for use in a circuit embodying the invention.
Figure 7:
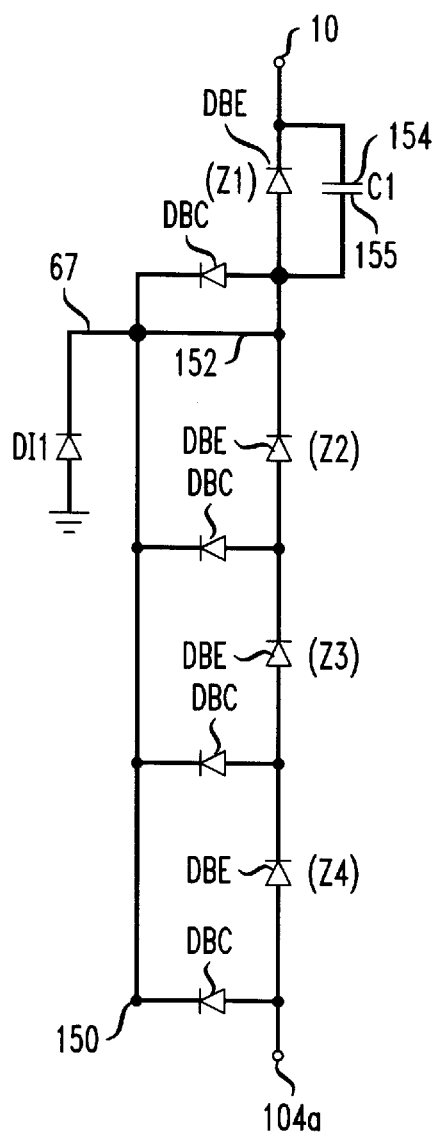
FIG. 7 is a simplified equivalent schematic diagram of the circuitry shown in FIGS. 5 and 6.
Figure 6:
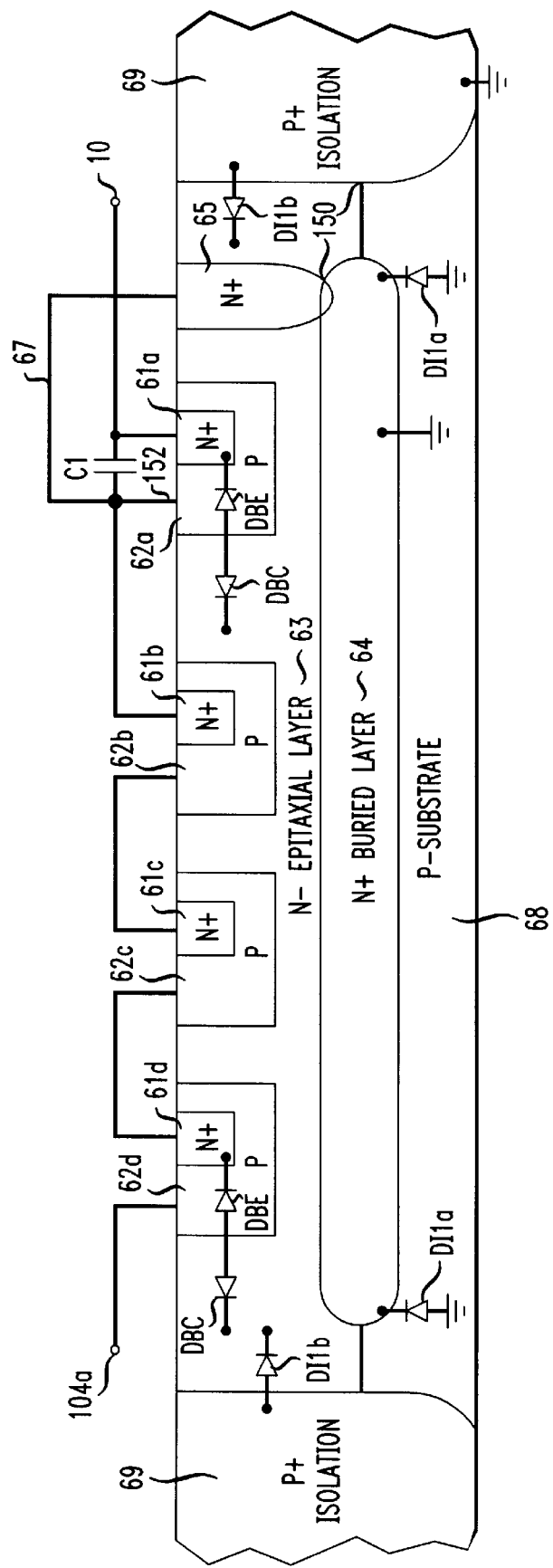
FIG. 6 is a cross-section of an integrated semiconductor circuit for forming a zener network of the type shown in FIG. 5.

FIGS. 5, 6 and 7 illustrate the formation of a zener network like network 171 with discharge diodes, such as DI1, DI2 and DI3, as an integral part of an integrated circuit (IC) used to form the zener clamping and feedback network 171. For ease of illustration, only four "zener" elements are shown in FIGS. 5, 6 and 7. The zener network in the feedback circuit 171 may be formed from parts of bipolar transistors (e.g., Q1, Q2, Q3 and Q4), as shown in FIG. 5. The base-to-emitter junction (DBE) of each transistor (Q1, Q2, Q3, Q4) functions as a zener diode having a clamping zener voltage ($V_Z$ or $V_R$) when conducting in the reverse direction and a forward voltage drop ($V_F$) when conducting in the forward direction. The base-to-emitter junctions are connected in series between terminal 10 and a selected internal node 104a. In FIG. 5, a capacitor C1 is shown connected across the base-to-emitter junction of Q1. Two networks of the type shown in FIG. 5 would be used to form the network 171 of FIG. 4, together with isolation diodes DI1 and DI2.

FIG. 6 shows a cross section of a portion of an integrated circuit for forming a zener diode network corresponding to the structure shown in FIG. 5, and formed to include, as an integral part thereof, discharge diodes for the by-pass capacitor C1, where the discharge diode(s) is (are) a collector-to-substrate diode.

FIG. 6 shows four (4) N+ regions (61a, 61b, 61c, 61d) each of which is formed in its respective P-type region (62a, 62b, 62c, 62d). These four PN junctions form the base-to-emitter regions (DBE) of 4 bipolar transistors. These four regions are designed to operate as zener diodes having a predetermined reverse breakdown voltage ($V_R$), also referred to herein as the zener voltage (Vz), when conducting in the reverse direction. The four base to emitter junctions are connected in series so that the zener (or reverse breakdown) voltage of the network between terminals 10 and 104a is the sum of the four individual diodes. The four P-regions (62a, 62b, 62c, 62d) are formed in an N-type epitaxial layer region 63, which includes an N+ buried layer 64, to form four base-to-collector regions or diodes (DBC). The epitaxial layer 63 includes an N+ buried layer 64 which is highly conductive and functions to interconnect the collector regions with a deep N+ region 65 which is connected via a conductor 67 to the base region 62a and to one side of capacitor C1. The other side of capacitor C1 is connected to N+ region 61a and to terminal 10.

The epitaxial layer 63 and the N+ buried layer 64 are formed within a P-type substrate region 68 which defines the collector-to-substrate diode(s) (DIa) used to discharge by-pass capacitor C1. P+ isolation region 69 which surrounds the zener network also forms PN junctions with the epitaxial layer 63 defining diodes DIb, also used to discharge the by-pass capacitor. Therefore, each discharge diode shown as DI1 in FIGS. 5 and 7 is a combination and/or composite of DIa and DIb.

Applying ground potential (or another appropriate reference potential) to regions 68 and 69 effectively applies ground potential to the anodes of the discharge diodes DI1a and DI1b.

The by-pass capacitors (e.g., C1 and C5) may be formed by various means. A common means is the use of a polysilicon/oxide/polysilicon capacitor sandwich and each by-pass capacitor may be connected across any selected PN junction.

FIG. 7 illustrates that the four base-to-emitter diodes (DBE) of transistors Q1, Q2, Q3, Q4 shown in FIGS. 5 and 6, may be represented as 4 zeners (Z1, Z2, Z3 and Z4) connected in series between nodes 10 and 104a, with capacitor C1 connected across zener Z1. FIG. 7 also illustrates that the anode of each zener is connected via a base-to-collector diode (DBC) to a common node 150. A discharge diode DI1, which is a composite of diodes DI1a and DI1b, is connected between a point of reference potential and node 150.

For the reasons discussed above, the zener network 171 shown in FIG. 4 provides a significant advantage over the prior art zener network shown in FIG. 1. However, there is a subtle and unexpected problem with the lay-out of the by-pass capacitors (C1, C5) and the placement of discharge diodes (e.g., DI1,DI2), as shown in FIG. 4, which prevents obtaining full advantage of the waveshaping circuitry. This is best explained with reference to FIGS. 8A and 8B, as discussed below.

Figure 8A:
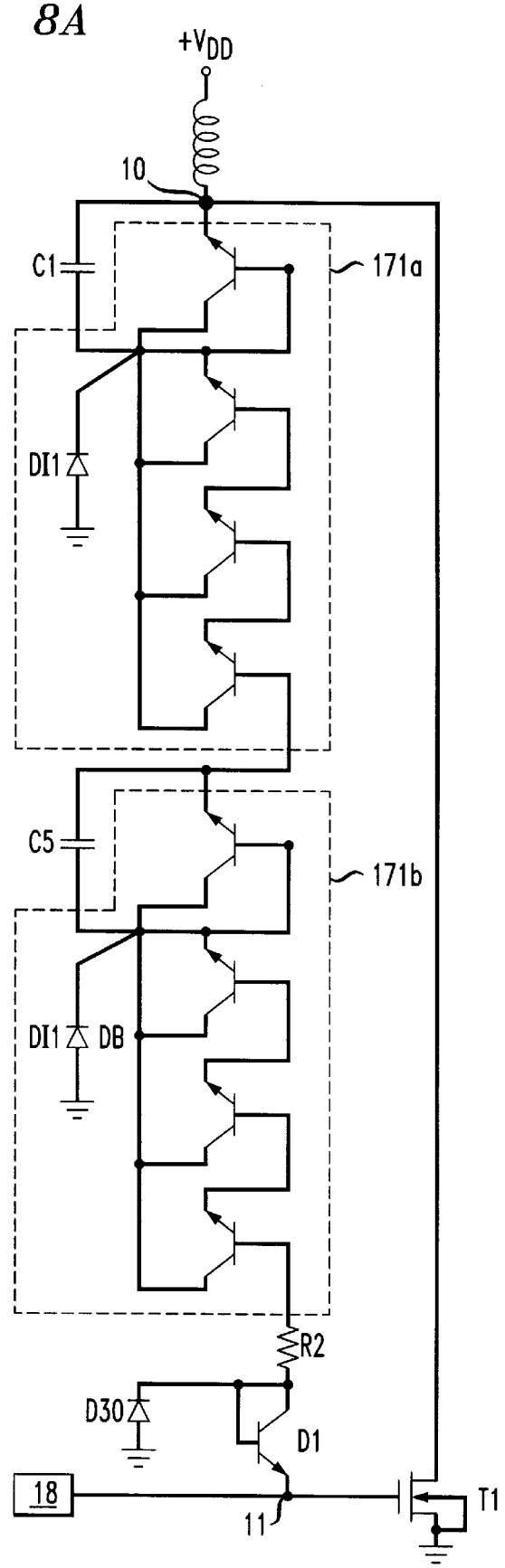
FIGS. 8A, 9A and 10A are schematic diagrams of circuits with EMI reducing networks in accordance with the invention.
Figure 8B:
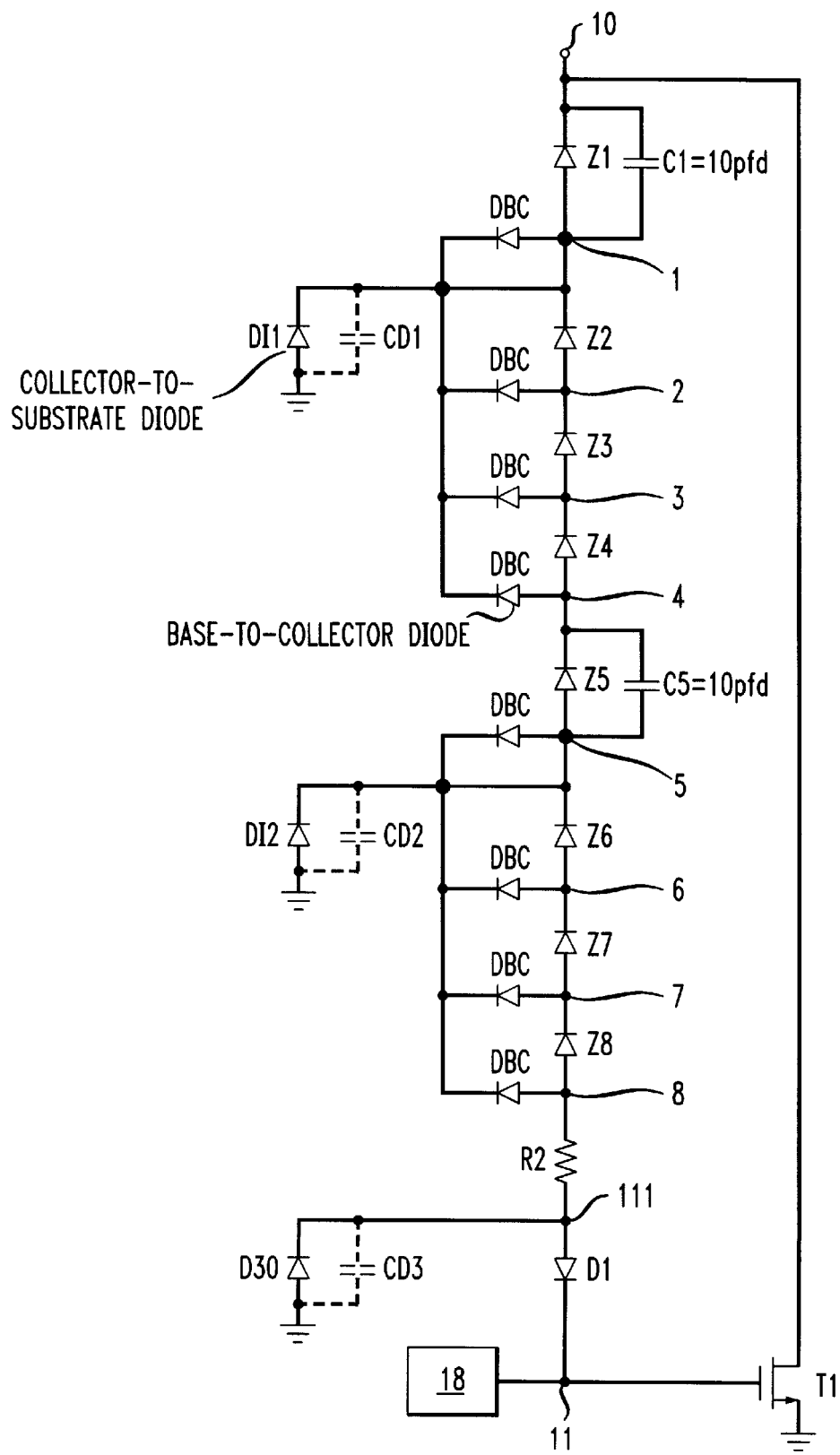
FIGS. 8B, 9B and 10B are simplified equivalent schematic diagrams of the EMI reducing networks shown in FIGS. 8A, 9A and 10A, respectively.

FIGS. 8A and 8B are schematic diagrams illustrating how integrated networks of the type shown in FIGS. 5, 6, and 7 may be interconnected to form a zener network of the type shown schematically in FIG. 4. In FIGS. 8A and 8B, the entire zener network connected between the drain and gate of T1 and corresponding to network 171 of FIG. 4, is shown to include two sub-zener networks 171a and 171b connected in series with a resistor R2 and a forward biased diode D1 between output terminal 10 and the gate 11 of T1. Each one of the zener networks 171a and 171b may be of the type shown in FIGS. 5, 6 and 7.

Figure 8C:
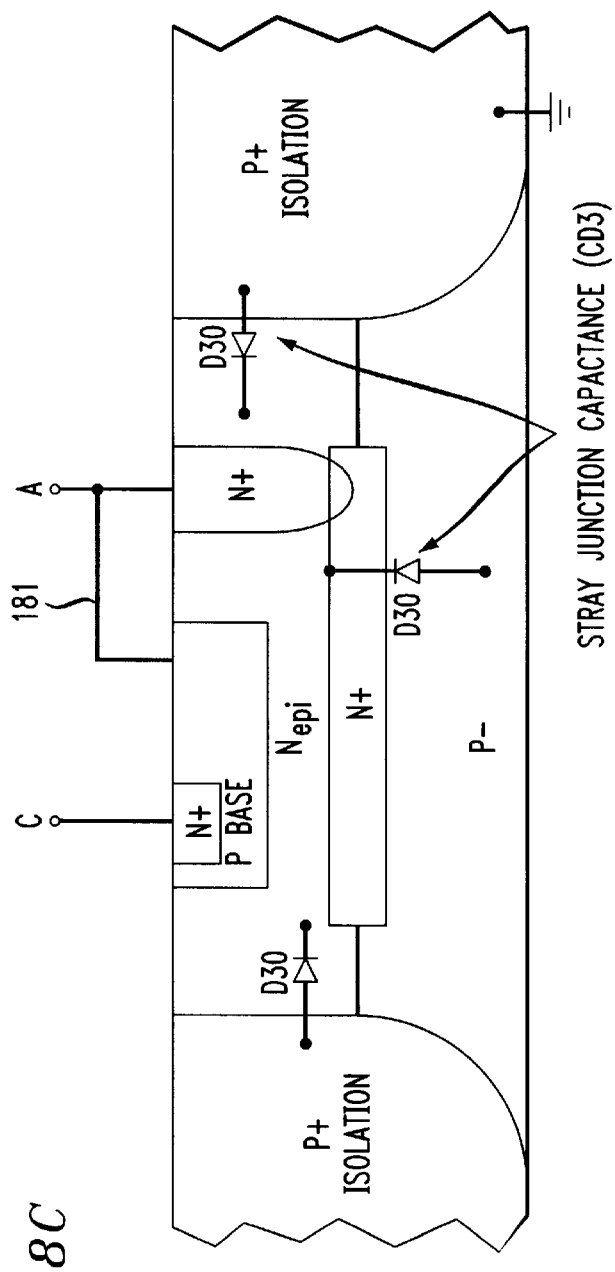
FIG. 8C is a cross section diagram of a semiconductor circuit to form diodes D1 and D30, shown in FIGS. 8–10.
Figure 8D:
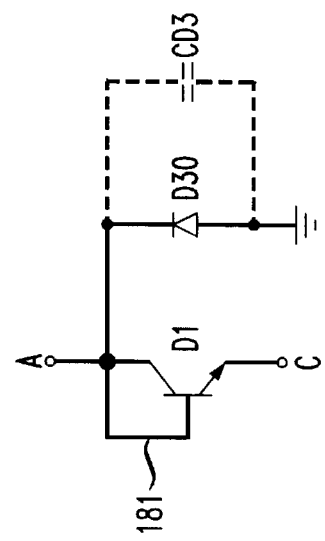
FIG. 8D is a schematic diagram of the circuitry of FIG. 8C.

FIG. 8B is an otherwise simplified schematic diagram of the circuit of FIG. 8A, drawn to indicate that there is a "parasitic" capacitance CD1 across diode DI1, a "parasitic" capacitance CD2 across diode DI2, and a "parasitic" capacitance CD3 across diode D30. Diode D1 may be formed from a bipolar transistor whose base and collector are interconnected via a wire 181, and diode D30 with stray junction capacitance defining CD3 may be formed as shown in FIGS. 8C and 8D.

A careful analysis of the circuit of FIGS. 8A and 8B reveals that "parasitic" capacitor CD1 forms a voltage divider with C1, that "parasitic" capacitor CD2 forms a voltage divider with C5 and that "parasitic" capacitor CD3 also acts to form a voltage divider with C5 when Z6, Z7, Z8 are conducting. As detailed below the voltage divider action due to the presence of these parasitic capacitances (CD1, CD2, CD3) causes charge (and a voltage) to be developed across the by-pass capacitors which adversely impacts the shunting action of the by-pass capacitors.

Assume that: (a) each one of by-pass capacitors C1 and C5 has a capacitance of 10 picofarads (pf); (b) each one of diodes DI1, DI2 and DI3 has a "parasitic" capacitance of 1 picofarad; (c) the zener (reverse breakdown) voltage (Vz) of each zener diode is 10 volts; and (d) the by-pass capacitors (C1, C5) are initially discharged before transistor T1 is turned-off. For the circuit shown in FIGS. 8A and 8B, when transistor T1 is turned-off and a positive voltage spike is produced at output terminal 10 which tends to exceed 80 volts, it is desired that: (a) initially, the output voltage at terminal 10 should be limited to a voltage equal to 60 volts (i.e., the sum of the 6 zeners [Z2–Z4 and Z6–Z8] which are unbypassed) plus the threshold voltage ($V_T$) of T1 which is approximately equal to 2 volts; and (b) after the by pass capacitors (C1, C5) get charged up to 10 volts, that the voltage at output terminal 10 be clamped to 80 volts, (i.e., the sum of the 8 zener voltages). However, it should be noted that capacitor C1 and the capacitance of DI1 are connected in series between output terminal 10 and ground. Consequently, when T1 turns off and the voltage at terminal 10 rises to 60 volts, a (charging) voltage is developed across C1 due to voltage division between C1 and CD1; (For the values assumed above, it would be approximately equal to 5.5 volts; i.e., 60 volts times 1/11). Therefore, the zener network which is intended to begin limiting the voltage at the output terminal when the voltage reaches 60 volts does not do so until a somewhat higher voltage is present. In addition, the breakdown of Z1 will occur when the voltage across C1 rises from approximately 5.5 volts to 10 volts, rather than when the voltage across C1 rises from 0 volts to 10 volts. Therefore, a desired longer, slower, waveshaping of the output voltage is not obtained. The problem is illustrated using, by way of example, C1 and CD1. However, a similar problem exists with C5 and CD2 and with C5 and CD3.

For the values assumed above, when T1 is turned-off and the potential at terminal 10 rises above 65–70 volts, the voltage across the stack of zener will be distributed approximately as follows. The voltage at node 1 will be 4 to 5 volts below the voltage at output terminal 10 because of the charge distribution between capacitor C1 and capacitor CD1. That is, C1 will be charged up to some significant value during the initial positive going spike. The voltage at node 2 will be 10 volts below the voltage at node 1, the voltage at node 3 will be 10 volts below the voltage at node 3, and the voltage at node 4 will be 10 volts below the voltage at node 3. Due to the voltage division between C5 and the parasitic capacitor CD2 of DI2, the voltage developed across CD2 will be in the range of 2 to 3 volts (for the capacitance and zener values assumed above). Consequently, it is evident that the zener network will not begin to limit the voltage spike at 60 volts and waveshaping of the type shown in FIG. 11 will not occur. Rather the break would occur around 65–70 volts and would have a different characteristic than the one expected. Thus, the significant rounding of the waveshape to reduce EMI will not be achieved.

Figure 9A:
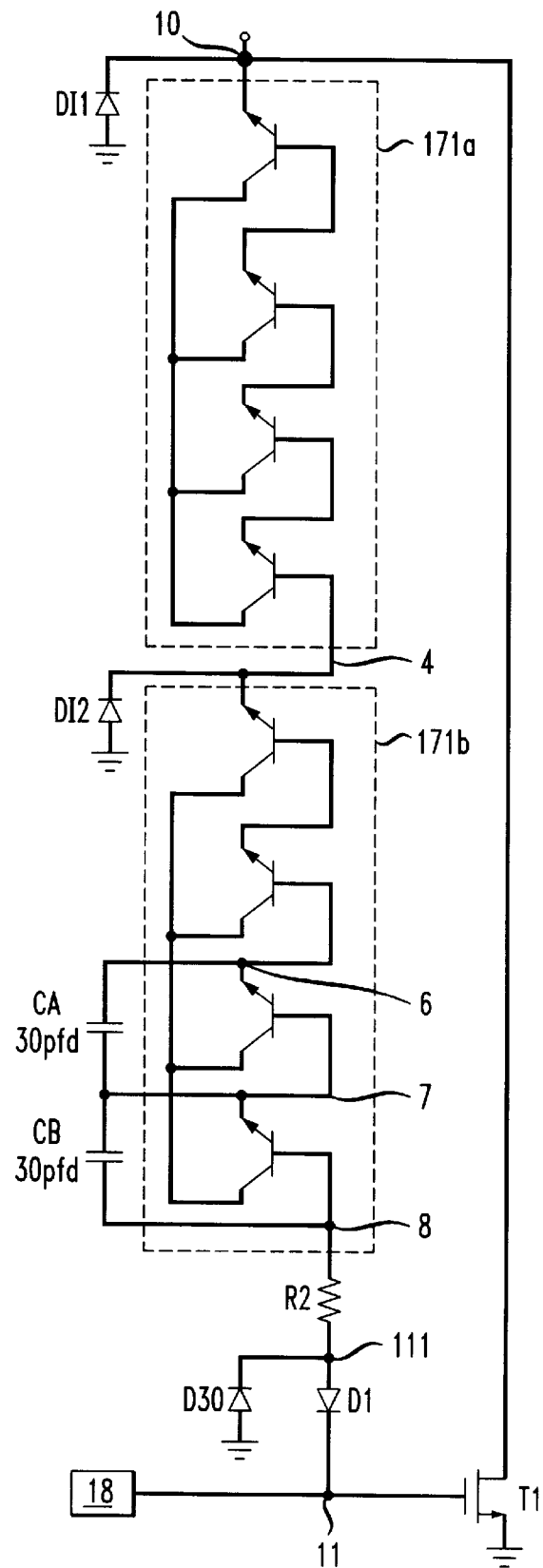
Figure 10A:
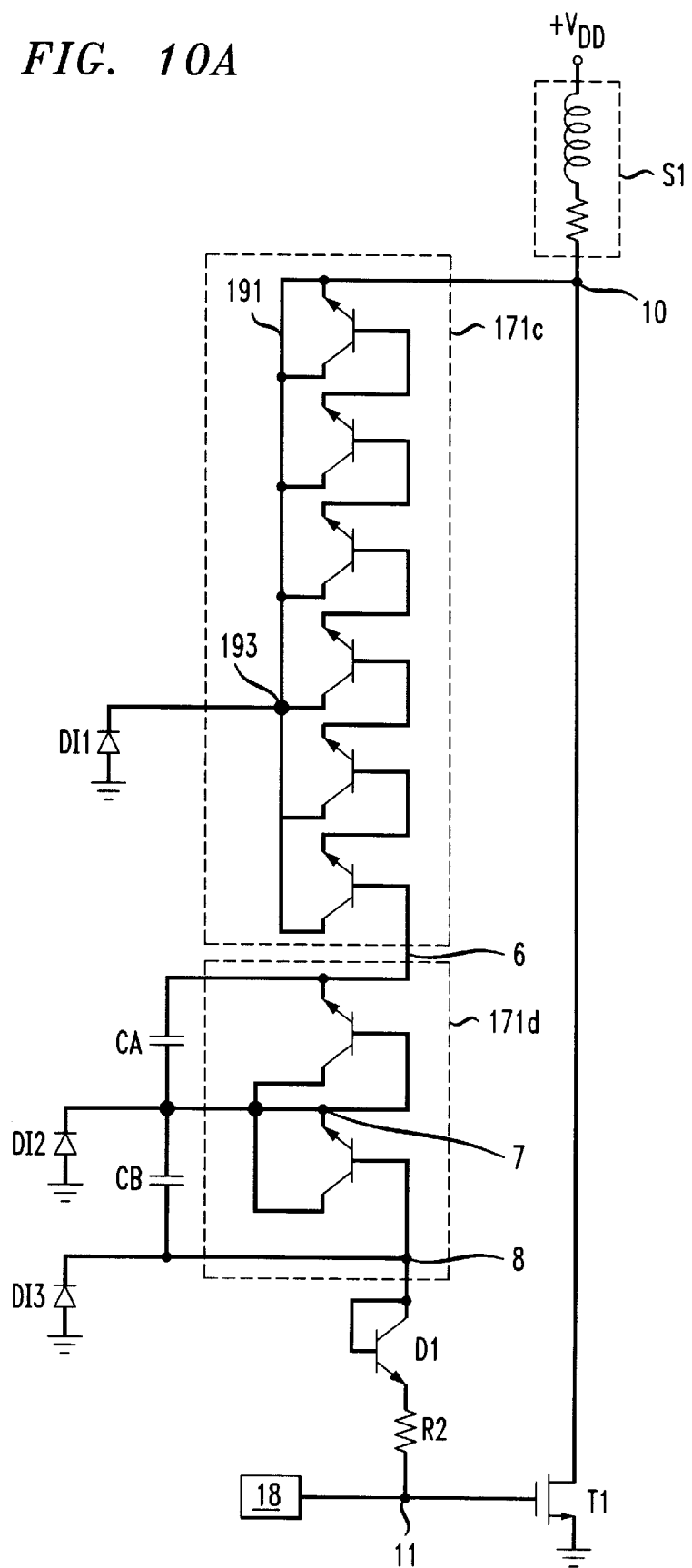

Applicant recognized that this problem may be resolved by placing the by-pass capacitors near the "bottom" of the stack of zener diodes as shown in FIGS. 9A and 10A.

In FIG. 9A the by-pass capacitors are identified as CA and CB and they are connected across the zener diodes (i.e., Z7 and Z8, respectively) closest to the gate 11 of transistor T1 (i.e., closest to the bottom of the stack of zeners). FIG. 9A is like FIG. 8A except for the placement of the by-pass capacitors. Also, in FIG. 9A, capacitor CA is much larger (i.e., 30 picofarad) than capacitor CB (i.e., 10 picofarad).

Figure 9B:
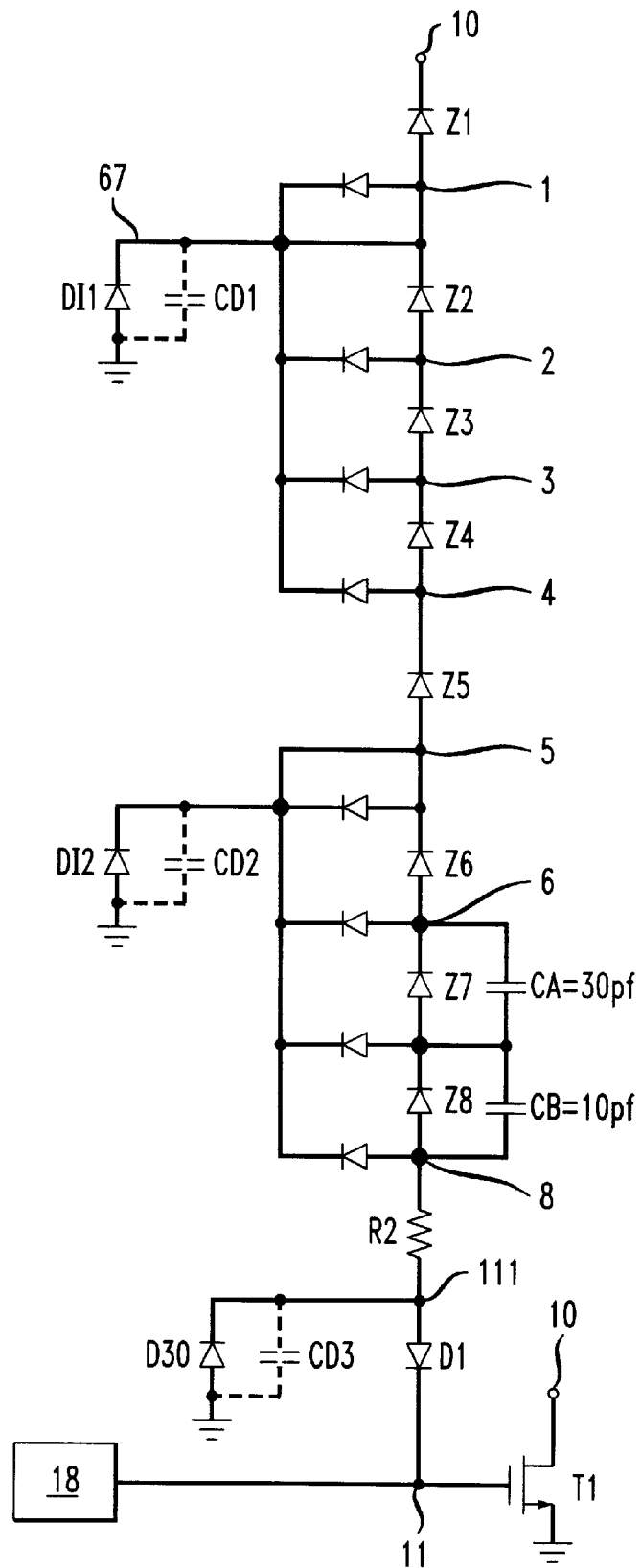

The base-to-emitter diodes, the base-to-collector diodes, and stray and parasitic capacitances inherent in the circuitry of FIG. 9A are detailed in FIG. 9B. Note that capacitor CA is connected between nodes 6 and 7 and capacitor CB is connected between nodes 7 and 8. A resistor R2 is connected between nodes 8 and 111. Diode D30 is shown connected between node 111 and ground, with D30 poled to conduct conventional current from ground into node 111 while blocking current in the opposite direction. As before, diode D1 is connected between nodes 111 and 11 to conduct current from terminal 10 and via the zener stack into the gate of T1 while blocking current in the opposite direction. A control network 18 of the type shown in FIGS. 1 and 4 is connected to the gate of transistor T1.

Assuming that the zener voltage Vz (also referred to herein and in the appended claims as $V_R$) of the zener diodes is 10 volts per diode, the operation of the circuit of FIGS. 9A and 9B is as follows. When T1 is being turned-off (after having been on) and the potential at output terminal 10 rises sharply, as soon as the voltage at terminal 10 exceeds the gate voltage of T1 by more than 60 to 65 volts, zener diodes Z1 through Z6 break down in the reverse direction and limit the voltage between output terminal 10 and node 6 to 60 volts (See FIG. 9B). A charging current then flows through zeners Z1 through Z6, capacitors CA and CB, forward biased diode D1 and network 18 to ground. Note that capacitors CA and CB tend to short out zeners Z7 and Z8. Ideally, initially there should be zero voltage developed across these capacitors. However, as discussed above, these by-pass capacitors (CA, CB) are in series with the parasitic capacitance CD3 of D30. Consequently the voltage at node 6 gets divided among capacitors CA, CB and CD30. But, by selecting the placement of the by-pass capacitors so that they are placed at the "bottom" of the zener diode stack, only small voltages are developed across the by-pass capacitors as compared to the condition shown in FIGS. 8A and 8B. This is further explained as follows.

The voltage at node 6 sees capacitor CA in series with capacitor CB in series with parasitic capacitor CD3 of diode D3 (for ease of discussion assume R2 is equal to zero). Assume that CA is 30 picofarads, CB is 10 picofarads and CD3 is 1 picofarad. For the assumed values of CA, CB and CD3 (and prior to $V_{CA}$ and/or $V_{CB}$ reaching 10 volts or Z4 and/or Z8 conducting), the voltages initially developed across these capacitors are, approximately, as follows:

Voltage across CD3 (VC3)=(7.5/8.5)V6;
Voltage across CA (VCA)=(10/40)(V6/8.5); and
Voltage across CB (VCB)=(30/40)(V6/8.5).

Since the voltage V6 at node 6 is on the order of two or three volts, the charge and voltage developed on capacitors CA and CB will be very small compared to the eventual 10 volts charge placed on them. As current continues to flow through the zeners, capacitors CA and CB charge up until the charge across these capacitors reaches 10 volts, then the zener diode associated with each capacitor conducts in the reverse (zener) direction and clamps the voltage across its associated capacitor to 10 volts. When capacitors CA and CB are each finally charged up to 10 volts, the total voltage between terminal 10 and node 8 will be approximately 80 volts.

Figure 11:
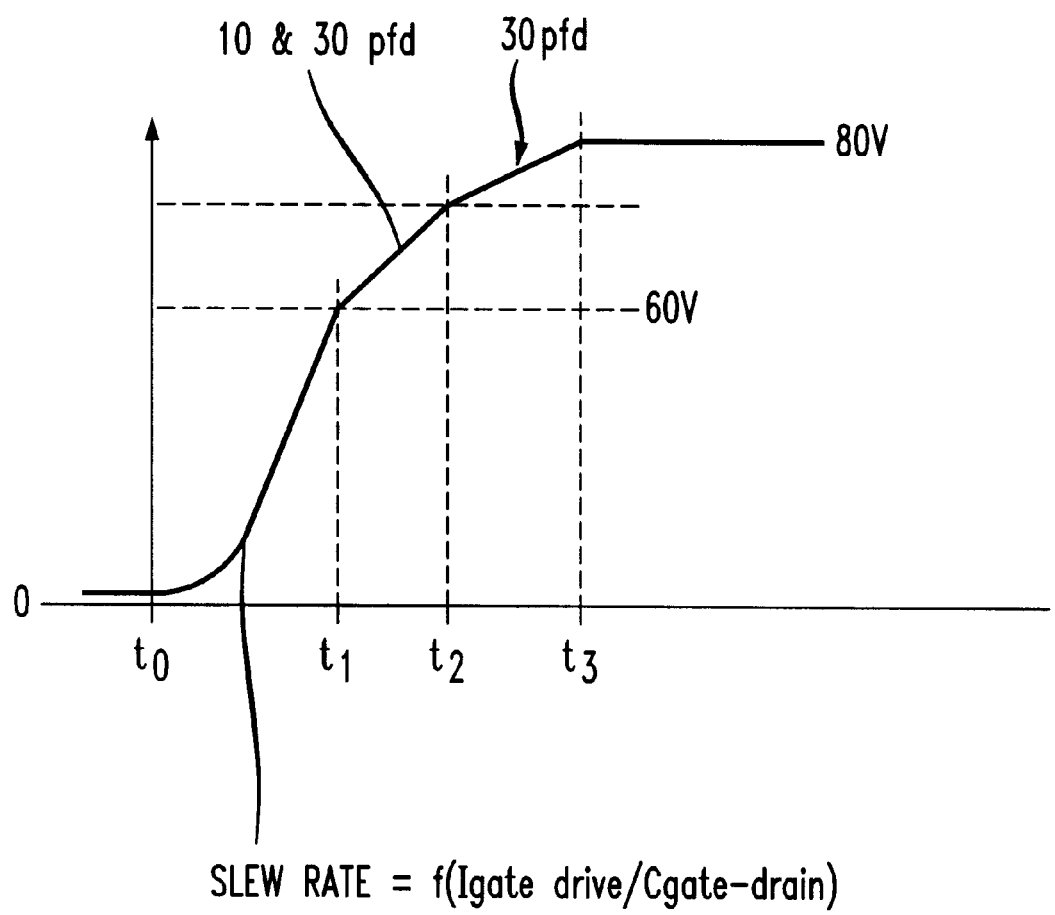
FIG. 11 is a diagram of an output waveform of a circuit embodying the invention.

By using by-pass capacitors of different values (e.g., CA=30 pf, CB=10 pf), the charging up of these two different capacitors will occur at different times enabling the waveform at output terminal 10 to be shaped as shown in FIG. 11, to further reduce production of EMI.

However, there may be a problem with fully discharging node 7 in the circuit of FIGS. 9A and 9B. This is resolved in the waveshaping network shown in FIGS. 10A and 10B.

Figure 10B:
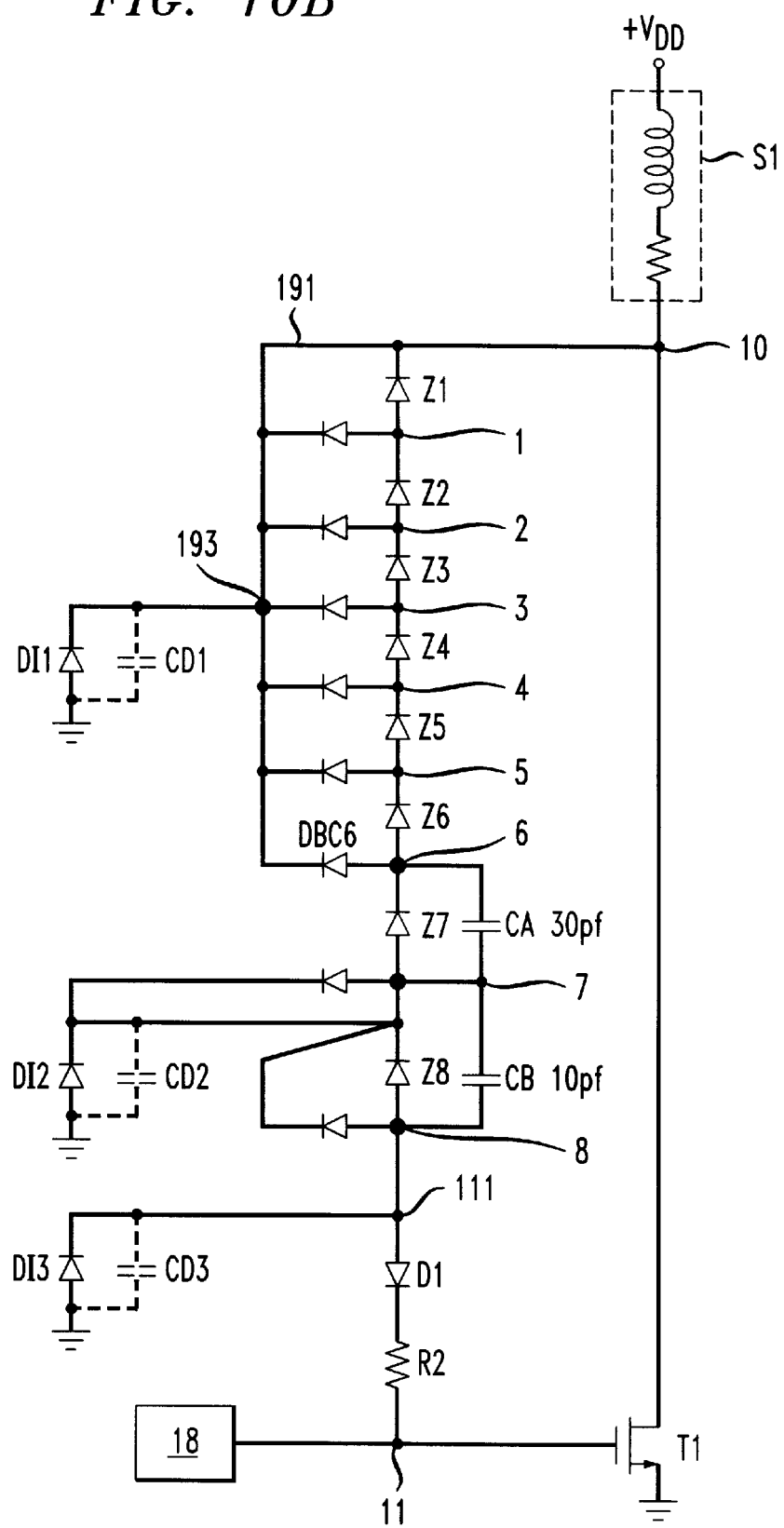

FIGS. 10A and 10B show a first zener network 171c which includes 6 zener diodes (Z1 through Z6) connected in series between output terminal 10 and a node 6. A second zener network 171d which includes two zener diodes (Z7 and Z8) is connected in series with network 171c between node 6 and a node 8. A bypass capacitor CA is connected across Z7 between nodes 6 and 7 and a bypass capacitor CB is connected across Z8 between nodes 7 and 8. FIG. 10A illustrates that each one of the two zener networks 171c, 171d may be formed by using components of the type shown in FIG. 6 or any other suitable like components. Diodes D1 and DI3 may be formed as shown in FIGS. 8C and 8D or any other suitable manner. Note, that in this embodiment the collector-to-substrate diode (DI2) of network 171d is connected at its anode to ground and at its cathode via a direct connection to node 7, to which the lower plate of CA is connected. Note that in this embodiment, the base-to-collector diode DBC6 is connected between node 6 and a node identified as node 193. Note further that a wire (or another negligible impedance) connection, 191, is made between node 193 and output terminal 10. Thus, diodes DI2 and DBC6 function to provide a low impedance discharge path for capacitor CA when T1 is turned-on. Diode DI3

(similar to diode D30 in FIGS. 8 and 9) is connected between node 8 and ground. DI3, together with the forward paths of Z7 and DBC6, functions to provide a discharge path for capacitor CB when T1 is turned-on.

The operation of the circuit of FIGS. 10A and 10B will first be examined for the condition when T1 is being turned-off after having been turned-on. When T1 is turned off, and a high amplitude positive going spike is produced at output terminal 10, Z1 through Z6 break down in the reverse (zener) direction, with each one of these diodes dropping the voltage by 10 volts. The voltage at node 6 will rise by a few volts. Assume for purpose of illustration that the voltage at node 6 rises to 5 volts. Note that capacitor CA and parasitic capacitance CD2 of diode DI2 are connected in series and from a voltage divider. However, assume that CA is in the order of 30 picofarads while CD2 is in the order of 1 picofarad. For the assumed voltage of 5 volts at node 6 and the assumed values of CA and CD2, the voltage developed across CA will be less than 200 millivolts [i.e., 5 volts(1/31)=0.16 volts]. The voltage developed and stored across CA is therefore not significant. Note also that capacitor CB and the parasitic capacitance CD3 of diode DI3 also form a voltage divider network. Assume that CB is made equal to 10 picofarad while the capacitance of CD3 is equal to 1 picofarad. Then, the voltage developed across CB will be less than 0.5 volts. This low voltage level will have little effect on the initial limiting voltage at which the zener network is designed to clamp the output voltage.

As shown in FIG. 11, after the initial clamping (limiting) voltage (e.g., 60 volts) is established, the voltage continues to rise with a first time constant determined by the charging rate of CA and CB. When the voltage across CB reaches 10 volts, zener diode Z8 breaks down and holds the voltage between nodes 7 and 8 at 10 volts. However, the voltage across CA continues to rise with a second time constant which is a function of the charging rate of CA, until the voltage across CA reaches 10 volts. At this point zener diode Z7 breaks down and holds the voltage across CA equal to 10 volts. Consequently the voltage between output terminal 10 and the gate 11 of T1 will be maintained at approximately 80 volts (ignoring the drop across R2 and the forward voltage drop of diode D1). As shown in FIG. 11 and in the circuits of FIGS. 10A and 10B, after T1 begins to be turned-off at time $t_0$, the voltage rises to 60 volts relatively quickly, at time $t_1$. Then from time $t_1$ to time $t_2$, the voltage continues to rise more slowly with a time constant determined by capacitors CA and CB. Then from time $t_2$ to time $t_3$, the voltage continues to rise even more slowly until it reaches 80 volts. Note that the resultant output curve has been smoothed to reduce EMI radiation.

Subsequently, when transistor T1 is turned on, capacitors CA and CB can discharge via relatively low impedance paths due to the presence of diodes DI2 and DI3 and the action of base-to-collector diodes and even some of the zener diodes conducting in the forward direction. As shown in FIGS. 10A and 10B, a discharge path is produced having a low impedance and limited voltage drop. Therefore, the by-pass capacitors (e.g., CA, CB) are always mostly discharged when transistor T1 is being turned-off and by-pass action is desired to shape the output waveform, as desired.

What is claimed is:

1. A combination comprising:
   a transistor having first and second electrodes defining the ends of its main conduction path and a control electrode for controlling the conductivity of its conduction path;
   means for connecting an inductive load to the first electrode of the transistor;
   means for connecting the second electrode of the transistor to a first point of reference potential;
   a circuit responsive to an input signal connected to the control electrode of the transistor for selectively turning it on and off; and
   a network connected between the first and control electrodes of the transistor comprising:
   (a) "X" PN junctions; where "X" is an integer greater than one; means connecting the "X" PN junctions in series between the first electrode and the control electrode of the transistor;
   (b) a bypass capacitor connected across at least one of the "X" PN junctions; and
   (c) discharging means connected in series with said by-pass capacitor between said first point of reference potential and the first electrode of the transistor for providing a discharge path for the by-pass capacitor when the transistor is turned on.

2. A combination as claimed in claim 1, wherein said means connecting the "X" PN junctions in series between the first electrode and the control electrode of the transistor includes a first unidirectional conducting means for enabling conventional current flow in only one direction from the first electrode through the "X" PN junctions into the control electrode of the transistor.

3. A combination as claimed in claim 2, wherein said discharging means includes a second unidirectional conducting means poled to conduct current in the opposite direction to said one direction.

4. A combination as claimed in claim 3 wherein said first unidirectional conducting means includes means for charging the bypass capacitor; and wherein said second unidirectional conducting means includes means for discharging the bypass capacitor.

5. A combination as claimed in claim 4, wherein said transistor is a metal-oxide semiconductor (MOS) transistor wherein said first electrode is a drain electrode, wherein said second electrode is a source electrode, and wherein said control electrode is a gate electrode.

6. A combination as claimed in claim 5 wherein said inductive load is part of a solenoid.

7. A combination as claimed in claim 4 wherein each one of said "X" PN junctions has a zener voltage (Vz) when conducting in the reverse direction and a forward voltage drop (Vf) when conducting in the forward direction.

8. A combination as claimed in claim 7, wherein each one of said "X" PN junctions is the base-to-emitter junction of a transistor.

9. A combination as claimed in claim 7 wherein said "X" PN junctions are the base-to-emitter junctions of "X" transistors; wherein said network includes "X" additional PN junctions forming the base-to-collector junctions of said "X" transistors;
   wherein the collectors of said "X" transistors are connected to a common point; and
   wherein said second unidirectional conducting means is connected to said common point.

10. A combination as claimed in claim 9 wherein said "X" PN junctions, said "X" additional PN junctions, and said second unidirectional conducting means are formed as part of a single integrated circuit (IC).

11. A combination as claimed in claim 9 wherein said by-pass capacitor is connected across the PN junction electrically closest to the control electrode of the transistor.

12. A combination as claimed in claim 9 wherein said network includes two by-pass capacitors, each one of said two by-pass capacitors being connected across one of said "X" PN junctions closest to the control electrode of the transistor and wherein there is a unidirectional conduction discharge path in series with each one of said by-pass capacitors for discharging the by-pass capacitors when the transistor is turned-on.

13. A combination as claimed in claim 1 wherein said network is for controlling the shape and for limiting the electromagnetic radiation of the signal produced at the first electrode when the transistor is being turned-off and is formed as part of a single integrated circuit (IC).

14. A combination comprising:
  first and second power terminals for the application therebetween of an operating potential;
  a transistor having first and second electrodes defining the ends of its main conduction path and a control electrode for controlling the conductivity of its conduction path;
  means for connecting an inductive load between the first electrode of the transistor and the first power terminal;
  means connecting the second electrode of the transistor to the second power terminal;
  a circuit responsive to an input signal connected to the control electrode of the transistor for selectively turning it on and off;
  "X" PN junctions; where "X" is an integer greater than one, each PN junction having a zener voltage Vz when conducting in the reverse direction and a forward voltage drop Vf when conducting in the forward direction;
  means connecting the "X" PN junctions in series between the first electrode and the control electrode of the transistor so that the zener voltages add up;
  a bypass capacitor connected across at least one of the "X" PN junctions; and
  discharging means connected in series with said by-pass capacitor between a point of reference potential and the first electrode of the transistor for providing a discharge path for the by-pass capacitor when the transistor is turned on.

15. A combination as claimed in claim 14, wherein said means connecting the "X" PN junctions in series between the first electrode and the control electrode of the transistor includes diode means for enabling conduction in only the reverse direction through the "X" PN junctions.

16. A combination as claimed in claim 15, wherein said discharging means connected in series with said by-pass capacitor between a point of reference potential and the first electrode of the transistor includes a diode poled to conduct current in its forward direction which forward direction is the opposite to the reverse direction through the "X" PN junctions.

17. A combination as claimed in claim 16 wherein said means for enabling conduction in only one (the reverse) direction through the "X" PN junction includes means for charging the bypass capacitors; and wherein said discharging means includes a diode pole to conduct current in a direction opposite to said reverse direction.

18. A combination as claimed in claim 17, wherein said transistor is a metal-oxide semiconductor (MOS) transistor wherein said first electrode is a drain electrode, wherein said second electrode is a source electrode, and wherein said control electrode is a gate electrode.

19. A combination as claimed in claim 18 wherein said inductive load is part of a solenoid.

20. A combination comprising:
  first and second power terminals for the application therebetween of an operating potential;
  a transistor having first and second electrodes defining the ends of its main conduction path and a control electrode for controlling the conductivity of its conduction path;
  means for connecting an inductive load between the first electrode of the transistor and the first power terminal;
  means connecting the second electrode of the transistor to the second power terminal;
  a circuit responsive to an input signal connected to the control electrode of the transistor for selectively turning it on and off;
  N zener diodes where N is an integer greater than one;
  means connecting the N zener diodes in series between the first electrode and the control electrode of the transistor;
  a bypass capacitor connected across at least one of the N zener diodes; and
  means connected in series with said by-pass capacitor between a point of reference potential and the first electrode of the transistor for providing a discharge path for the by-pass capacitor when the transistor is turned on.

21. A combination as claimed in claim 20, wherein said means connecting the N zener diodes in series between the first electrode and the control electrode of the transistor includes diode means for enabling conduction in only one direction through the zener diodes.

22. A combination as claimed in claim 21, wherein said means connected in series with said by-pass capacitor between a point of reference potential and the first electrode of the transistor includes a diode poled to conduct current in the opposite direction to said one direction.

23. A combination as claimed in claim 22 wherein said means for enabling conduction in only one direction through the zener diodes includes means for charging the bypass capacitors; and wherein said means including a diode poled to conduct current in the opposite direction to said one direction are poled to discharge the bypass capacitors.

24. A combination comprising first and second power terminals for the application therebetween of an operating potential;
  a transistor having first and second electrodes defining the ends of a main conduction path and a control electrode for controlling the conductivity of its conduction path;
  means for connecting an inductive means between the first electrode of the transistor and the first power terminal;
  means connecting the second electrode of the transistor to the second power terminal;
  a circuit responsive to an input signal connected to the control electrode of the transistor for selectively turning it on and off;
  a string of "X" PN junctions functioning as zener diodes connected in series between the first electrode and the gate electrode of the transistor for providing conduction therebetween when the voltage at the first electrode exceeds the sum of the zener breakdown voltages of the string of "X" PN junctions; where "X" is greater than one;
  a by-pass capacitor connected across one of the "X" PN junctions for initially shunting that one of the "X" PN junctions and limiting the voltage at the first electrode,
  discharging means connecting a unidirectional conducting element in series with the by-pass capacitor between a point of reference potential and the first electrode of the transistor for providing a discharge path for the capacitor when the transistor is turned on.

25. An IC for forming a waveshaping network comprising:
  a first substrate region of first conductivity type;
  a second region of second conductivity type overlying said first region;
  one of said first and second conductivity types being of N conductivity type and the other one being of P conductivity type;
  a first set of "X" regions of first conductivity being formed within said second region; and
  a second set of "X" regions of second conductivity type, each one of said "X" regions of said second set being formed within one of the "X" regions of said first set;
  whereby said first and second regions define a first PN junction; whereby said second region and said first set of "X" regions defines a first set of "X" PN junctions; whereby said first and second sets of "X" regions defines a second set of "X" PN regions;
  means connecting said second set of "X" PN regions in series between first and second terminals;
  means forming a by-pass capacitor across at least one of said "X" PN regions in said second set; and
  means for shunting one of the PN junctions in said first set for providing a low impedance conduction path between said first PN junction and one of the "X" regions of first conductivity type.

26. An integrated circuit (IC) for producing a waveshaping network comprising:
  "X" PN junctions formed within said IC, each one of said "X" PN junctions having a forward voltage ($V_{F1}$) drop when conducting in the forward direction and having a reverse breakdown voltage ($V_{R1}$) when conducting in the reverse direction, said "X" PN junctions being connected in series between first and second terminals for forming a zener network having a zener voltage equal to the sum of the $V_{R1}$'s of the "X" PN junctions; said "X" PN junctions being formed within a first region of first conductivity type;
  a by-pass capacitor connected across a selected one of said "X" PN junctions; said "X" PN junctions being poled to charge the by-pass capacitor when conducting in the reverse direction;
  said first region being formed within a substrate region of second conductivity type for forming an isolation PN junction having a forward voltage drop ($V_{F2}$) which is approximately equal to $V_{F1}$ and a reverse breakdown voltage $V_{R2}$ which is greater than the sum of the $V_{R1}$'s of the "X" PN junctions; and
  means connecting one end of said isolation PN junction to one side of said by-pass capacitor and means for connecting the other end of said isolation PN junction to a point of reference potential for enabling said isolation PN junction to discharge said capacitor.

* * * * *